United States Patent
Chen et al.

(10) Patent No.: US 10,868,945 B2
(45) Date of Patent: Dec. 15, 2020

(54) LIGHT-FIELD CAMERA AND METHOD USING WAFER-LEVEL INTEGRATION PROCESS

(71) Applicant: OmniVision Technologies, Inc., Santa Clara, CA (US)

(72) Inventors: Teng-Sheng Chen, Hsinchu (TW); Jau-Jan Deng, Taipei (TW); Chia-Yang Chang, Sunnyvale, CA (US); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/377,391

(22) Filed: Apr. 8, 2019

(65) Prior Publication Data

US 2020/0322507 A1    Oct. 8, 2020

(51) Int. Cl.
*H04N 5/225*    (2006.01)
*G02B 13/00*    (2006.01)
(Continued)

(52) U.S. Cl.
CPC ..... *H04N 5/22541* (2018.08); *G02B 13/0015* (2013.01); *G02B 27/0961* (2013.01);
(Continued)

(58) Field of Classification Search
CPC ........... H04N 5/22541; H04N 5/23212; H04N 5/2256; H04N 5/2254; H04N 5/2258; G02B 13/0015; G02B 27/0961; G02B 13/001; G02B 27/0075; H01L 27/14625; G06K 9/209; G06T 2207/10052
(Continued)

(56) References Cited

U.S. PATENT DOCUMENTS 8,497,934 B2    7/2013 Milnes et al.
10,057,498 B1*   8/2018 Nunnink ............ H04N 5/2254
(Continued)

FOREIGN PATENT DOCUMENTS

CN    203219391 U    9/2013
CN    103417181 A    12/2013

OTHER PUBLICATIONS

Mukati et al., Hybrid-sensor high-resolution light field imaging, IEEE Xplore, Figure 1 (Year: 2017).*

*Primary Examiner* — Albert H Cutler
(74) *Attorney, Agent, or Firm* — Lathrop GPM LLP

(57) ABSTRACT

A camera module has light-field camera(s) and high resolution camera(s), the light-field camera(s) have multiple-lens arrays above an image sensor. The light-field camera(s) have a lens element at a same level as a lens element of the high resolution camera, the lens elements bearing apertures. The multiple-lens array of the light-field camera is above the image sensor at a same level as a flat transparent plate of the high resolution camera. The cameras lens cubes are made simultaneously by bonding molded lens plates and spacer plates, the lens plates and spacer plates including an upper lens plate having upper light-field camera lens elements and upper high resolution camera lens elements with applied apertures, multiple spacer plates, a microlens plate bearing an array of microlenses in the light-field cameras, the microlens plate being flat and transparent in areas of the high resolution camera.

10 Claims, 4 Drawing Sheets

(51) Int. Cl.
*H04N 5/232* (2006.01)
*G02B 27/09* (2006.01)
*H01L 27/146* (2006.01)

(52) U.S. Cl.
CPC ..... *H01L 27/14625* (2013.01); *H04N 5/2254* (2013.01); *H04N 5/2256* (2013.01); *H04N 5/23212* (2013.01)

(58) Field of Classification Search
USPC .......... 455/556.1, 556.2, 557; 438/57, 64–67
See application file for complete search history.

(56) References Cited

U.S. PATENT DOCUMENTS

| | | | |
|---|---|---|---|
| 2011/0080487 A1* | 4/2011 | Venkataraman | H04N 5/265 348/218.1 |
| 2013/0010260 A1 | 1/2013 | Tumlinson et al. | |
| 2014/0118516 A1* | 5/2014 | Suzuki | H04N 5/2254 348/65 |
| 2014/0168401 A1* | 6/2014 | De Bruijn | H04N 7/18 348/78 |
| 2014/0183334 A1 | 7/2014 | Wang et al. | |
| 2014/0198187 A1* | 7/2014 | Lukk | H04N 13/271 348/49 |
| 2014/0334745 A1 | 11/2014 | Fleischer et al. | |
| 2015/0070474 A1* | 3/2015 | Bhat | H04N 5/2254 348/49 |
| 2015/0077522 A1* | 3/2015 | Suzuki | H04N 13/271 348/48 |
| 2015/0163406 A1* | 6/2015 | Laroia | H04N 5/23245 348/208.1 |
| 2016/0037152 A1* | 2/2016 | Kim | G06T 7/557 348/47 |
| 2017/0134639 A1* | 5/2017 | Pitts | H04N 5/23212 |
| 2020/0112671 A1* | 4/2020 | Kang | H04N 5/23232 |

* cited by examiner

```
┌─────────────────────────────────────────────────────────────────┐
│ Form Integrated Image Sensor Array with Nanolenses over Photodiodes. 302 │
└─────────────────────────────────────────────────────────────────┘
                              │
┌─────────────────────────────────────────────────────────────────┐
│     ┌─────────────────────────────────────────────────┐         │
│     │         Mold Upper Lens Plate 306               │         │
│     └─────────────────────────────────────────────────┘         │
│                              │                                  │
│     ┌─────────────────────────────────────────────────┐         │
│     │ Deposit & Mask Opaque Aperture Material on Upper Lens Plate 308 │
│     └─────────────────────────────────────────────────┘         │
│                              │                                  │
│     ┌─────────────────────────────────────────────────┐         │
│     │ Form and Attach Spacer Plate to Upper Lens Plate Bottom 310 │
│     └─────────────────────────────────────────────────┘         │
│                              │                                  │
│     ┌─────────────────────────────────────────────────┐         │
│     │ Deposit & Mask Opaque Aperture Material on Aperture Plate 312 │
│     └─────────────────────────────────────────────────┘         │
│                              │                                  │
│     ┌─────────────────────────────────────────────────┐         │
│     │ Form and Attach 2nd Spacer Plate to Aperture Plate Bottom 314 │
│     └─────────────────────────────────────────────────┘         │
│                              │                                  │
│     ┌─────────────────────────────────────────────────┐         │
│     │ Mold Lower Lens Plate, Deposit and Mask Aperture Material 316 │
│     └─────────────────────────────────────────────────┘         │
│                              │                                  │
│     ┌─────────────────────────────────────────────────┐         │
│     │   Attach Lower Lens Plate to 2nd Spacer Plate 318│         │
│     └─────────────────────────────────────────────────┘         │
│                              │                                  │
│     ┌─────────────────────────────────────────────────┐         │
│     │ Form and Attach 3nd Spacer Plate to Lower Lens Plate Bottom 320 │
│     └─────────────────────────────────────────────────┘         │
│                              │                                  │
│     ┌─────────────────────────────────────────────────┐         │
│     │         Mold Lower Microlens Plate 322          │         │
│     └─────────────────────────────────────────────────┘         │
│                              │                                  │
│     ┌─────────────────────────────────────────────────┐         │
│     │    Attach Microlens Plate to 3rd Spacer Plate 324│         │
│     └─────────────────────────────────────────────────┘         │
│                              │                                  │
│     ┌─────────────────────────────────────────────────┐         │
│     │ Form and Attach 4th Spacer Plate to Microlens Plate Bottom 326 │
│     └─────────────────────────────────────────────────┘         │
│                                                           304   │
└─────────────────────────────────────────────────────────────────┘
                              │
       ┌─────────────────────────────────────────────────┐
       │      Cut and Fill Camera Isolation Trenches 332 │
       └─────────────────────────────────────────────────┘
                              │
       ┌─────────────────────────────────────────────────┐
       │ Attach Lens Cube Assembly to Integrated Image Sensor Array 330 │
       └─────────────────────────────────────────────────┘
                              │
       ┌─────────────────────────────────────────────────┐
       │   Dice Wafer of Upper Lens Cubes into Modules 334│
       └─────────────────────────────────────────────────┘
                              │
       ┌─────────────────────────────────────────────────┐
       │      Bond Modules into Camera Packages 336      │
       └─────────────────────────────────────────────────┘
```

Fig. 4

LIGHT-FIELD CAMERA AND METHOD USING WAFER-LEVEL INTEGRATION PROCESS

BACKGROUND

Light-field cameras, also known as plenoptic cameras, capture more information than that captured by standard cameras. They may capture information regarding both intensity of light in a scene, and also the direction the light rays are traveling in space. Light-field camera images can be processed to produce images as if taken at several different focal distances, or to enhance depth of focus of images, or to allow selective decrease of depth of focus to blur objects at distances from the camera that differ from the distance of a desired subject.

Some light-field cameras 100, including the original Lippmann design of 1908, have a microlens array 104 ahead of film 106 or an image sensor (prior art) as illustrated in FIG. 1. A focus lens 102 focuses light 112 from a scene 110 onto the microlens array 104 and thence to film 106. Lens 102, microlens array 104, and film 106 or image sensor being mounted in an opaque barrel 108.

SUMMARY

We have applied wafer-level image optical sensor fabrication techniques to fabrication of light-field cameras.

A camera module has light-field camera(s) and high-resolution camera(s), the light-field camera(s) have multiple-lens arrays above an image sensor. The light-field camera(s) have a lens element at a same level as a lens element of the high-resolution camera, the lens elements bearing apertures. The multiple-lens array of the light-field camera is above the image sensor at a same level as a flat transparent plate of the high-resolution camera.

The cameras' lens cubes are made simultaneously by bonding molded lens plates and spacer plates. The lens plates and spacer plates include an upper lens plate having upper light-field camera lens elements and upper high-resolution camera lens elements with applied apertures, multiple spacer plates, a microlens plate bearing an array of microlenses in the light-field cameras The microlens plate is flat, transparent, and antireflection-coated in areas of the high-resolution camera.

BRIEF DESCRIPTION OF THE FIGURES

FIG. 4 is a partial flowchart of a method of manufacture of a method of making a light-field camera.

DETAILED DESCRIPTION OF THE EMBODIMENTS

Figure 1:
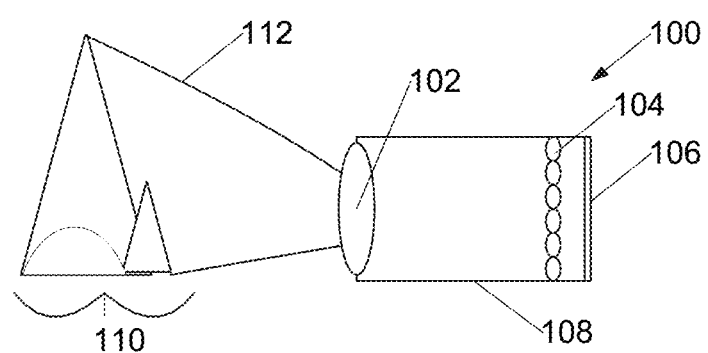
FIG. 1 is a prior art schematic view of a traditional light-field camera.
Figure 2:
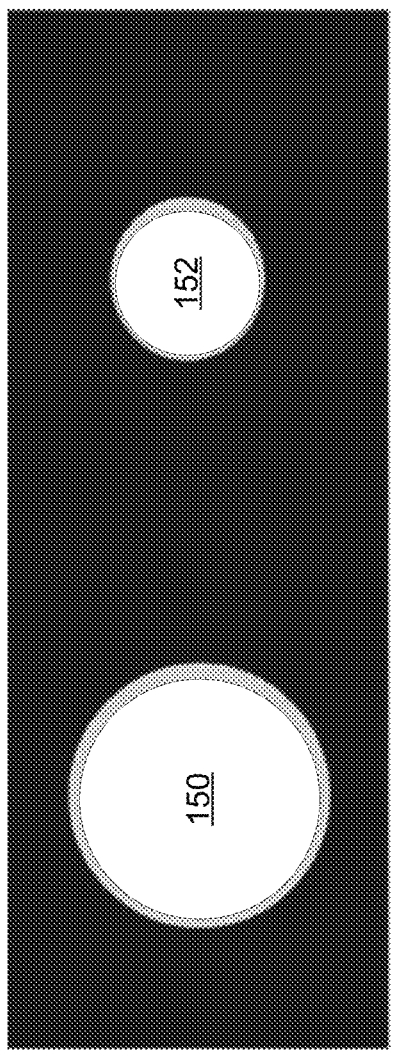
FIGS. 2 and 3 are a lens and lateral view of paired light-field and high-resolution cameras, respectively.

A two-camera module having 1×2 layout and including a camera pair of a light-field camera 150 (FIG. 2), 202 (FIG. 3) and a high-resolution traditional camera 152 (FIG. 2), 204 (FIG. 3), are formed simultaneously and diced from wafer-level integrated optics. In alternative embodiments, 2×2 or 1×3, 4×4, or 3×3 camera modules are formed similarly, with various counts of high-resolution and light-field cameras; for example 2×2 rectangular modules with 4 cameras may have either 2 light-field cameras and 2 high-resolution cameras or 1 light-field camera with 3 high-resolution cameras. An integrated image sensor 206 with associated nanolenses is positioned at an appropriate image plane for the light-field camera 202. A second image sensor array 208 is positioned alongside it at a focal plane of the high-resolution traditional camera 204. The light-field and traditional cameras 202, 204 are separated by black light absorbing material 210. The simultaneously-formed light-field lens cube 212 and high-resolution lens cube 214 are applied atop the image sensor arrays 206, 208.

A rectangular array of lens cubes 212, 214, is formed, with each cube of the array being formed simultaneously by superimposing a sequence of molded plates each bearing an array of lenses, spacers, or similar structures. These lens and spacer plates are bonded or attached together to form the lens cubes.

Figure 3:
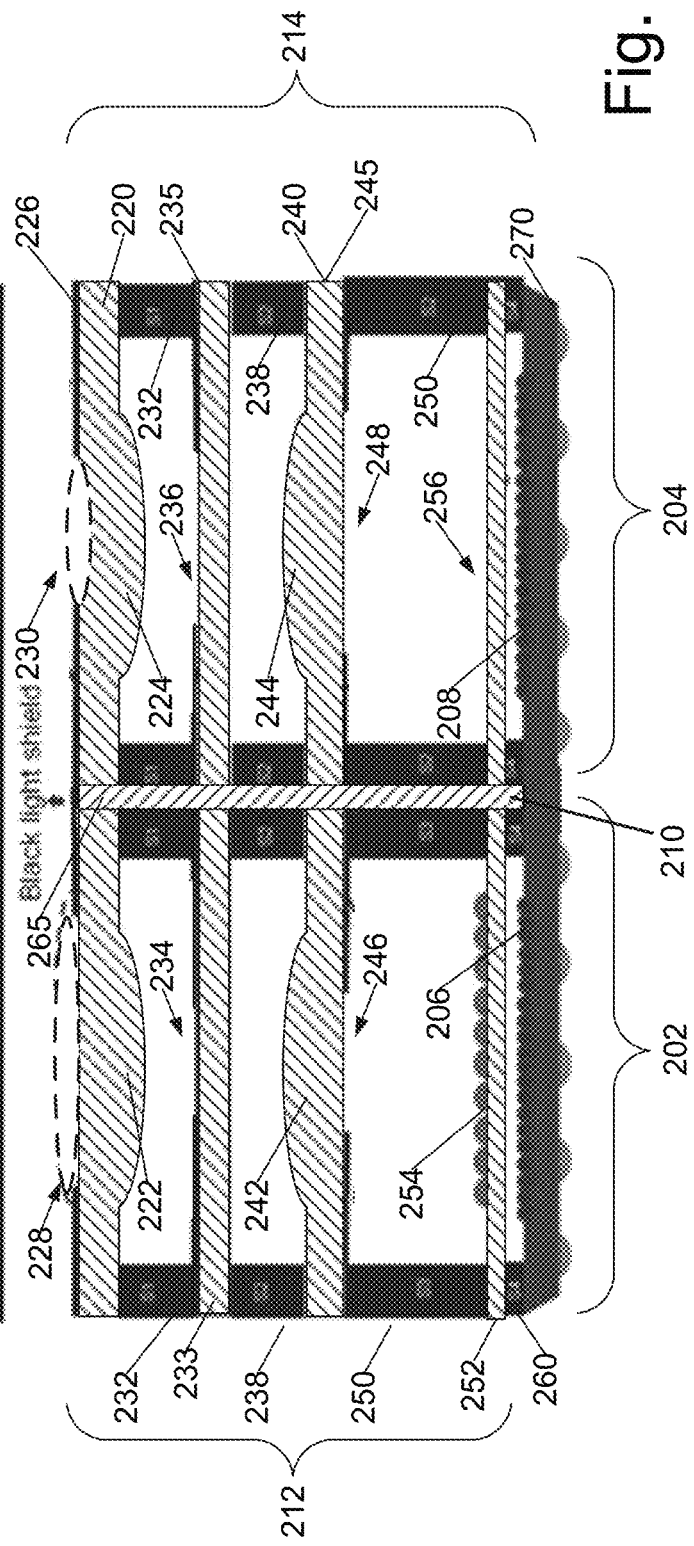
Figure 5:
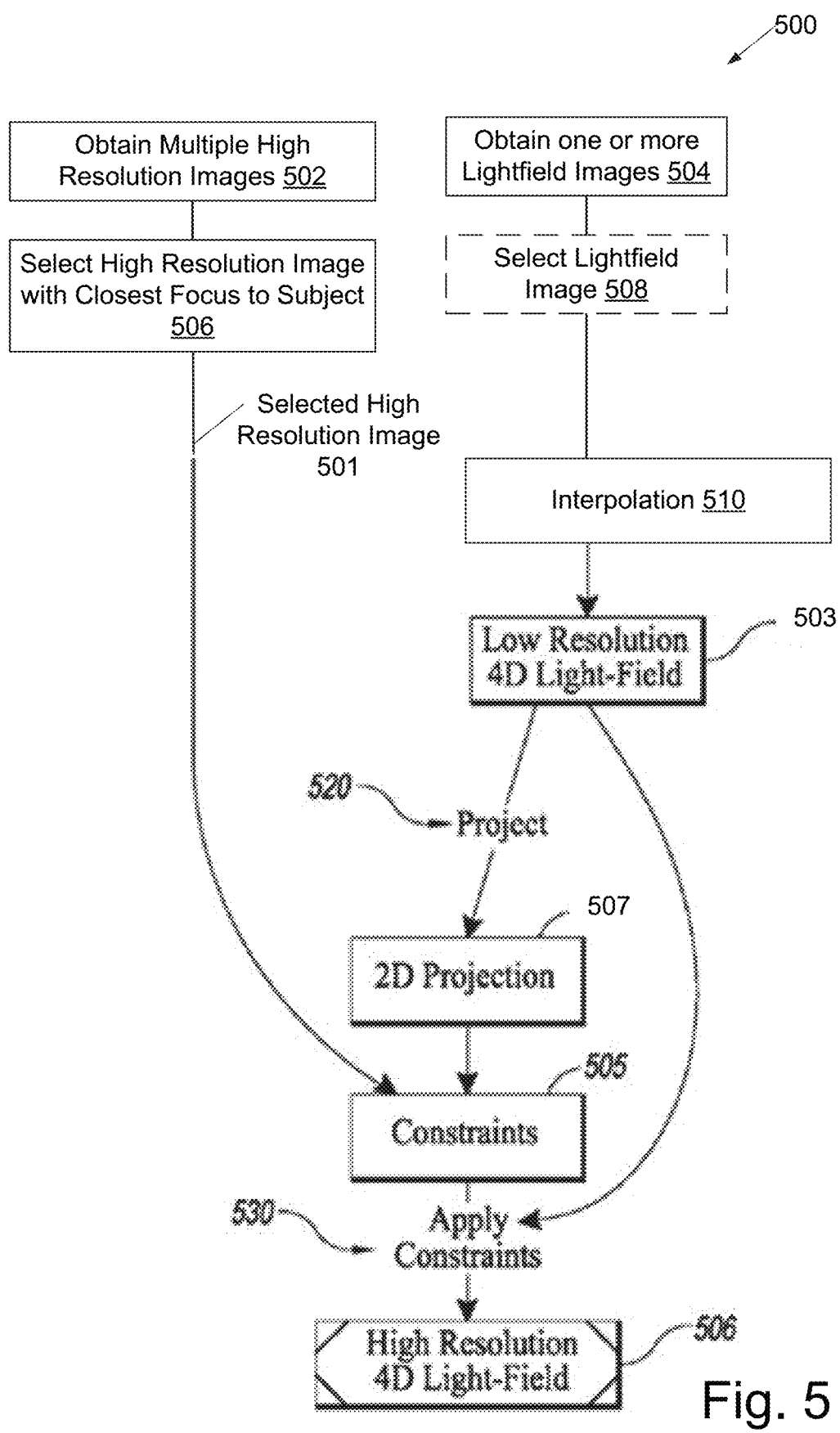
FIG. 5 is a partial flowchart of image processing using images from arrays of light-field and high-resolution cameras.

With reference to FIGS. 3 and 4, forming 300 the light-field and high-resolution cameras begins with fabricating 302 a wafer of integrated image sensors with integral nanolenses associated with each photodiode of the image sensors. This is performed using a standard image sensor fabrication process as known in the art of CMOS image sensors.

The lens cubes 212, 214 are formed 304 as a wafer of lens cubes. Forming the lens cubes 304 begins with molding 306 an upper lens plate 220 having an upper light-field camera lens element 222 and an upper high-resolution camera lens element 224 for each camera pair. Upper light-field camera lens element 222 and upper high-resolution camera lens element 224 may but need not have the same curvature, lens thickness, or shape. In a particular embodiment, the upper high-resolution camera lens elements of the upper lens plate 220 include an upper high-resolution camera lens element of more than one focal length so that high-resolution cameras may be formed with more than one focus range selected from near focus, distant focus, and intermediate focus.

Next, a layer of opaque aperture material 226, such as chrome metallization or black photoresist, is deposited on the upper lens plate 200 and an upper light-field aperture opening 228 and an upper high-resolution camera aperture opening 230 are formed in the opaque aperture material 226. Next, a spacer plate 232 is formed and attached 310 to a bottom of the upper lens plate. In a particular embodiment the upper light-field aperture opening 228 and upper high-resolution aperture opening 230 are of different diameters.

An aperture plate is formed from a flat, antireflective-coated, transparent plate 233 by depositing 312 a layer 235 of opaque material on the transparent plate 233 and masking and etching aperture openings 234, 236 for the light-field and high-resolution cameras, respectively. In embodiments, the aperture sizes for light-field and high-resolution cameras may differ. In a particular embodiment the opaque material is chrome or black photoresist. In an alternative embodiment, a central molded lens plate is used instead of a flat plate 233 resulting, when the cameras are complete, in three-element lenses for each of the light-field and high-resolution cameras instead of two-element lenses. The formed aperture plate 233 is then attached to a bottom of spacer 232.

A second spacer plate 238 is formed and attached 314 to a bottom of the aperture plate.

A second lens plate 240 is molded 316 with light-field camera lower lens element 242 and high-resolution camera element 244, and a layer 245 of opaque, black, material is deposited on it and masked to form a third pair of apertures 246, 248. This second lens plate 240 is then attached 318 to a bottom of the second spacer plate 238.

A third spacer plate 250 is formed and attached 320 to a bottom of the second lens plate 240.

A microlens plate 252, bearing an array of multiple microlenses 254 in the light-path area of the light-field camera 202, is molded. Microlens plate being flat, transparent, and treated with antireflective coatings where it serves as a transparent flat plate in an area 256 of the high-resolution camera 204. The transparent flat portion of the microlens plate 252 forms a transparent plate corresponding to, and at the same level as, the microlens-bearing portion of the microlens plate 252 that is below lens element 242 of the light-field camera 204.

A fourth spacer plate 260 is formed and attached 326 to a bottom of the microlens plate 252.

Next, the assembled lens cube is attached to a carrier wafer (not shown) with a soluble glue, and trenches are cut 332 between individual lens systems, such as the lens system formed by upper light-field camera lens element 222, lower light-field lens element 242, microlens array plate 252, and surrounding spacers, and the lens system of the high-resolution camera including upper high-resolution lens element 224 and lower high-resolution lens element 244 and surrounding spacers. These trenches are then filled with a black photoresist or black inter-camera light shield 265.

The wafer of lens cubes is then diced by sawing into 2×1 modular lens cubes having one each light-field lens cube with upper light-field lens element 222, lower light-field lens element 242, and microlens array plate 252, and high-resolution lens cubes having upper high-resolution lens element 224 and lower high-resolution lens element 244. In an alternative embodiment, the wafer of lens cubes is diced into 2×2 modular lens cubes, having two each of the light-field lens cube and high-resolution lens cubes. In yet another alternative embodiment, the wafer of lens cubes is diced into 3×2 arrays with three light-field and three high-resolution lens cubes each, or 4×4 arrays with four light-field and four high-resolution lens cubes each.

In 2×2 arrays, curvature of the upper and lower high-resolution lens elements 224, 244 may differ so that one high-resolution lens cube of the 2×2 array is optimized for focus at near distances and the other high-resolution lens cube of the 2×2 array is optimized for focus at far distances. Similarly, curvature of the upper and lower light-field lens elements may be configured and/or optimized for low magnification in one light-field lens cube of the 2×2 array and one light-field lens cube of the 2×2 array may be configured and/or optimized for high magnification. 3×2 and 4×4 arrays similarly may include lens cubes that are configured and/or optimized for both low and high magnification and near, far, and intermediate focus.

As is known in the art of color cameras, any or all of the cameras of the 1×2, 2×2, 3×2 or 4×2 arrays may have a color filter layer with a pattern of red, green, and blue filters applied above the photosensors of the image sensor. In a particular embodiment, the color filters of one or more cameras of the array includes a rectangular pattern of red, green, blue, and infrared-passing filters, the infrared-passing filter being a near-infrared-passing filter passing infrared light at 850 nanometers wavelength, 940 nanometers wavelength, or both.

The diced lens cube arrays are then attached 330 to integrated image sensor arrays 206, 208 and packaged 336 in ball grid array camera packages 270. The assembled camera packages are then coupled to image processors as known in the art of miniature electronic cameras.

In a particular embodiment, a 1×2 image sensor array as herein described is positioned in an endoscope and configured for viewing internal structures of a mammal such as a human.

Because they are formed simultaneously and in the same plate, upper light-field lens element 222 of the light-field lens cube and upper high-resolution lens element 224 of the high-resolution lens cube are coplanar and separated by a same distance from lower light-field lens element 242 and lower high-resolution lens element 244, and lower light-field lens element 242 and lower high-resolution lens element 244 are coplanar and separated by a second same distance from the image sensors. Further, light-field camera microlens plate 252 of the light-field lens cube has a corresponding flat plate in the high-resolution lens cube.

In these embodiments, the upper light-field lens element 222, upper high-resolution lens element 224, lower light-field lens element 242, and lower high-resolution lens element 244 are all fixed in position relative to the image sensors, providing each light-field camera and high-resolution camera with a fixed focus. Although the optical paths are fixed length, without adjustable focus, image processing of images captured with the light-field camera can overcome this fixed focus to provide images of adjustable focus in software.

In a particular embodiment, the light-field camera and high-resolution camera have identical image sensors.

In an embodiment 500, using a 2×2 or larger camera array such as a 2×3 or 2×4 camera array, two or more high-resolution camera images are recorded 502 by the camera array and at least one, and in some embodiments two or more light-field images, are recorded 504 by the camera array each time imaging is performed. In an embodiment having a near, intermediate, and far focus high-resolution camera, one of the high-resolution camera images having best focus at a plane of a desired subject is selected 506 for further processing. In particular embodiments having more than one light-field camera, a light-field image is also selected 508 according to best focus; in embodiments having a single light-field camera in the array the image from that camera is selected by default.

The selected high-resolution image has a higher image resolution than the low resolution lightfield image. The selected lightfield image and selected high-resolution camera images are then processed according to a method derived from the method of U.S. patent application 20140334745 to provide a higher resolution lightfield image.

The method continues after selection of the most appropriate high-resolution camera image by interpolation 510 or "up sampling" to provide a lightfield image having a pixel array corresponding to resolution of the selected high-resolution camera image. A projection operation 520 is then performed to project the lightfield image into a low-resolution two-dimensional image 507 having focus at the image plane of the selected high-resolution camera image using techniques known in the art of lightfield cameras.

The low-resolution two-dimensional image is then used, along with the selected high-resolution camera image to calculate constraints 505. The constraints 505 are a set of factors that map the two-dimensional projection 507 of the low-resolution lightfield image 503 to the selected high-resolution image 501. For example, the constraints 505 may include a coefficient for each pixel of the high-resolution image 501. The coefficient for each pixel of an embodiment is a value that, when multiplied by a data point in the two-dimensional projection 507 of the low resolution image provides the corresponding pixel value in the selected high resolution image 501. Other constraints may be used.

Once the constraints 505 have been determined, they are applied 530 to the raw low resolution lightfield image to provide a high resolution, composite, four-dimensional "lightfield" image having enhanced resolution over the original selected lightfield image 503.

In an alternative embodiment, instead of selecting a best high-resolution camera image showing a desired subject in best focus, constraints are derived from all high-resolution camera images and applied to give a single high-resolution four-dimensional image.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween. It is also anticipated that steps of methods may be performed in an order different from that illustrated and still be within the meaning of the claims.

What is claimed is:

1. A camera module comprising at least one light-field camera and at least one high resolution camera,
   the at least one light-field camera having a multiple-lens array positioned above a light-field camera image sensor;
   wherein the light-field camera comprises at least a first lens element above the light-field camera image sensor at a same level as a first lens element of the high resolution camera above a high resolution camera image sensor;
   the first lens of the light-field camera and the first lens of the high resolution camera having deposited thereon an opaque aperture material having an aperture opening formed therein; and
   the multiple-lens array of the light-field camera being at a second distance above the light-field camera image sensor at a same level as a flat transparent plate of the high resolution camera.

2. The camera module of claim 1 wherein the light-field camera further comprises a second lens element at a third distance above the light-field camera image sensor at a same level as a second lens element of the high resolution camera distance above the high resolution camera image sensor.

3. The camera module of claim 1 wherein the light-field camera and high resolution camera are packaged in a same ball grid array package.

4. The camera module of claim 1 wherein aperture opening of the opaque material deposited on the first lens element of the light-field camera has a different size than the aperture opening of the opaque material deposited on the first lens element of the high resolution camera.

5. The camera module of claim 1 wherein there are four cameras in the camera module.

6. The camera module of claim 5 wherein the camera module comprises a first high resolution camera having a first focus distance and a second high resolution camera having a second focus distance.

7. A method of forming a camera module comprising at least one light-field camera and at least one high resolution camera comprising:
   forming a rectangular array of light-field camera and high resolution lens cubes simultaneously by bonding molded lens plates and spacer plates, the lens plates and spacer plates comprising:
      an upper lens plate having upper light-field camera lens elements and upper high resolution camera lens elements;
      a layer of opaque aperture material, selected from the group consisting of a metal and a black photoresist, being deposited on the upper lens plate with upper light-field aperture openings and upper high resolution camera aperture openings formed in the opaque aperture material;
      a first spacer plate disposed adjacent a bottom of the upper lens plate;
      a microlens plate bearing an array of multiple microlenses in the area of the at least one light-field camera, the microlens plate being flat, transparent, and treated with antireflective coatings in areas of the at least one high resolution camera; and
      a second spacer plate attached to a bottom of the microlens plate; and
   bonding at least at least one light-field camera lens cube and at least one high resolution lens cube as formed in the rectangular array of lens cubes to image sensors attached to a same integrated circuit package.

8. The method of claim 7 wherein the lens plates and spacer plates further comprise:
   a transparent aperture plate having a layer of opaque material deposited thereon with aperture openings for the at least one light-field and at least one high resolution cameras, and
   a third spacer plate attached to a bottom of the aperture plate.

9. The method of claim 8 wherein the lens plates and spacer plates further comprise a second lens plate with light-field camera lower lens elements and high resolution camera elements formed thereon, and
   a fourth spacer plate attached to a bottom of the second lens plate.

10. The method of claim 9 further comprising cutting a trench between cameras and filling the trench with an opaque material.

* * * * *